(12) United States Patent
Abramovici et al.

(10) Patent No.: US 6,256,758 B1
(45) Date of Patent: Jul. 3, 2001

(54) FAULT TOLERANT OPERATION OF FIELD PROGRAMMABLE GATE ARRAYS

(75) Inventors: Miron Abramovici, Berkeley Heights, NJ (US); Charles E. Stroud, Lexington, KY (US)

(73) Assignees: Agere Systems Guardian Corp., Allentown, PA (US); University of Kentucky Research Foundation, Lexington, KY (US)

( * ) Notice: Subject to any disclaimer, the term of this patent is extended or adjusted under 35 U.S.C. 154(b) by 0 days.

(21) Appl. No.: 09/261,776

(22) Filed: Mar. 3, 1999

(51) Int. Cl.$^7$ ...................................................... G06F 11/00
(52) U.S. Cl. ..................... 714/724; 714/725; 714/733; 714/734
(58) Field of Search .................................. 714/724, 725, 714/733, 734, 735

(56) References Cited

U.S. PATENT DOCUMENTS

| | | |
|---|---|---|
| Re. 34,445 | 11/1993 | Hayes et al. . |
| 4,414,669 | 11/1983 | Heckelman et al. . |
| 4,757,503 | 7/1988 | Hayes et al. . |
| 4,817,093 | 3/1989 | Jacobs et al. . |
| 5,051,996 | 9/1991 | Bergeson et al. . |
| 5,081,297 | 1/1992 | Lebel et al. . |
| 5,090,015 | 2/1992 | Dabbish et al. . |
| 5,107,208 | 4/1992 | Lee . |
| 5,179,561 | 1/1993 | Izawa et al. . |
| 5,260,946 | 11/1993 | Nunally . |
| 5,278,841 | 1/1994 | Myers . |
| 5,361,264 | 11/1994 | Lewis . |
| 5,425,036 | 6/1995 | Liu et al. . |
| 5,430,734 | 7/1995 | Gilson . |
| 5,437,519 | 8/1995 | Cooke et al. . |
| 5,475,624 | 12/1995 | West . |
| 5,488,612 | 1/1996 | Heybruck . |
| 5,508,636 | 4/1996 | Mange et al. . |
| 5,623,501 | 4/1997 | Cooke et al. . |
| 5,991,907 * | 11/1999 | Stroud et al. ......................... 714/725 |
| 6,003,150 * | 12/1999 | Stroud et al. ......................... 714/725 |
| 6,108,806 * | 8/2000 | Abramovici et al. ................. 714/725 |

* cited by examiner

*Primary Examiner*—Phung M. Chung
(74) *Attorney, Agent, or Firm*—King & Schickli PLLC

(57) ABSTRACT

A method of fault tolerant reconfiguration and operation of a field programmable gate array (FPGA) during normal on-line operation includes selecting a programmable logic block as a programmable logic block under test, testing the programmable logic block under test, and detecting the existence of any faults in the programmable logic block under test. During testing, the programmable logic block under test is repeatedly reconfigured in order to test the programmable logic block completely in all possible modes of operation. Based on the results of the test, a test result indication is sent to a controller in communication with a memory for storing usage and fault status data for each programmable logic block. If a partially faulty test result indication is present, the controller determines an intended mode of operation of the partially faulty programmable logic block under test and reconfigures the logic block for further use, thus allowing a more gradual degradation of the field programmable gate array.

12 Claims, 1 Drawing Sheet

FAULT TOLERANT OPERATION OF FIELD PROGRAMMABLE GATE ARRAYS

TECHNICAL FIELD

The present invention relates generally to the field of integrated circuit devices and, more particularly, to fault tolerant operation of field programmable gate arrays.

BACKGROUND OF THE INVENTION

A field programmable gate array (FPGA) is a type of integrated circuit consisting of an array of programmable logic blocks interconnected by a programmable routing network and programmable input/output cells. Programming of the logic blocks, the routing network and the input/output cells is selectively completed to make the necessary interconnections that establish one configuration thereof to provide the desired system operation/function for a particular application.

The present inventors have recently developed methods of built-in self-testing the array of programmable logic blocks and the programmable routing network in FPGAs at the device, board and system levels. These methods are set out in detail in pending U.S. patent applications Ser. Nos. 08/729,117, 08/974,799 and 09/059,552. The full disclosures in these patent applications are incorporated herein by reference.

In each of these prior methods, the reprogrammability of an FPGA is exploited so that the FPGA is configured exclusively with built-in self-test (BIST) logic during off-line testing and subsequently reconfigured to its normal operating configuration. In this way, testability at every level is achieved without utilizing FPGA resources. In other words, the BIST logic simply "disappears" when the FPGA is reconfigured for its normal system function. While the use of these test methods is effective in testing the FPGAs, they are limited to off-line testing to determine the existence and location of faults within the FPGA resources.

In many high-reliability and high-availability applications, such as, space missions or telecommunication network routers, however, the FPGA hardware must work continuously and cannot be taken off-line for testing. For these systems, on-line testing must be performed concurrently with normal system operation. When faults are detected and located in the FPGA hardware of these systems, the FPGA hardware must be reconfigured to bypass the identified faulty resources. Such a process necessarily relies on spare parts or FPGA resources to replace the defective parts.

SUMMARY OF THE INVENTION

We have recognized that a need exists to extend the lifetime of a critical mission without increasing the number of available parts. For an FPGA, a part is any one of its programmable logic blocks. Since an FPGA programmable logic block has many modes of operation, it is likely that a fault would affect only some of these modes. Accordingly, the faulty logic block is still able to properly function in the modes of operation not affected by the fault. It necessarily follows that if the remaining functioning modes of operation of the partially faulty block matches the intended function for that block, the partially faulty block may continue to be utilized as if it were fault free. Advantageously, this approach to resource utilization provides for a more gradual degradation of FPGA hardware, thus extending the useful life of the system.

In accordance with the method of the present invention carried out during normal operation of the FPGA, test patterns are applied to a programmable logic block selected from the array of programmable logic blocks as a block under test. More specifically, the test patterns are varyingly applied to the underlying modules or blocks which make-up the programmable logic block under test in order to detect and locate the existence of any faults in those blocks which affect or limit the operation of the programmable logic block under test.

In accordance with an important aspect of the inventive method, each possible mode of operation of the programmable logic block under test is completely tested. To accomplish such a complete test, the programmable logic block under test is repeatedly reconfigured and exhaustive sets of test patterns sufficient to detect all possible faults in the blocks of the programmable logic block under test are applied.

Another important aspect of the inventive method, provides for the reconfiguration and further utilization of partially faulty programmable logic blocks. By reconfiguring partially faulty programmable logic blocks to avoid all operational modes affected by the detected fault, the partially faulty programmable logic blocks are allowed to continue to function in a progressively diminished, although acceptable, capacity for specific operating modes. Advantageously, this type of on-line fault tolerant reconfiguration provides for a more gradual degradation of the FPGA over prior known test methods whose primary goal is to completely bypass any faulty blocks.

The configuration, reconfiguration and control of the programmable logic block under test, on-line testing and storage of the subsequent test results are necessarily controlled by a test and reconfiguration controller and an associated storage medium. In operation, the test and reconfiguration controller accesses the FPGA through its boundary-scan ports during normal system operation (most FPGAs feature a boundary-scan mechanism). A test pattern generator provides the necessary test patterns dependent upon the configuration or mode of operation of the programmable logic block under test. The output patterns of the programmable logic block under test are compared to either known responses or output patterns produced by a reference programmable logic block receiving the same test patterns as the programmable logic block under test. The latter method is similar to the BIST techniques described in detail in the above noted pending patent applications incorporated herein by reference.

As described above, the controller further repeatedly reconfigures the programmable logic block under test for testing in all possible modes of operation. The results of the test pattern comparisons for each mode of operation of the programmable logic block under test along with usage data for the block under test are stored in the storage medium. The intended functional usage data for the block under test may be extracted at the design stage, or may be obtained utilizing a configuration decompiler which extracts the data from the configuration stream. In order to facilitate the subsequent fault tolerant reconfiguration and further operation of the programmable logic block under test, the results for each mode of operation are compared to the usage data for the programmable logic block under test.

BRIEF DESCRIPTION OF THE DRAWING

The accompanying drawing incorporated in and forming a part of the specification, illustrates several aspects of the present invention and together with the description serve to explain the principles of the invention. In the drawings.

Reference will now be made in detail to the present preferred embodiment of the invention, an example of which is illustrated in the accompanying drawing.

DETAILED DESCRIPTION OF THE INVENTION

A typical field programmable gate array (FPGA) generally consists of an array of programmable logic blocks interconnected by a programmable routing network and programmable input/output cells or boundary ports. Such structures are, for example, featured in the Lucent ORCA programmable function unit, in the Xilinx XC4000 configurable logic block and in the ALTERA FLEX 8000 logic element. In accordance with the method of the present invention carried out during normal operation of an FPGA, the programmable logic blocks of the FPGA are completely tested and partially faulty programmable logic blocks are reconfigured and allowed to continue to operate for limited purposes.

Figure 1:
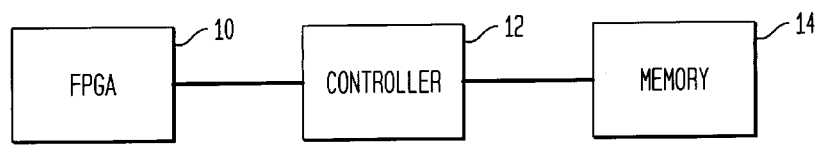
FIG. 1 is a schematic block diagram of an apparatus utilized to test a field programmable gate array.

As shown in schematic block diagram in FIG. 1, the steps of configuring and controlling an FPGA under test 10, on-line testing, and storing of the subsequent test results are necessarily controlled by a test and reconfiguration controller 12. In the preferred embodiment, an external controller 12 is utilized because present commercially available FPGAs do not allow internal access to their configuration memory. Accordingly, a configuration decompiler tool of a type known in the art is utilized to determine the intended mode of operation of the FPGA resources. Alternatively, this information may be extracted from the design stage and made available to the controller. It should be appreciated by those skilled in the art that any controller, e.g., internal or external to the FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

The preferred controller 12 may be implemented on an embedded microprocessor in communication with a storage medium or memory 14 for storing the configurations. In operation, the controller 12 accesses the system platform supported FPGA under test 10 through its boundary-scan mechanism, such that access is transparent to the normal function of the FPGA 10. Advantageously, this approach allows for the first time in the art complete on-line fault detection, diagnosis and reconfiguration during normal operation of the FPGA 10. The controller 12 and memory 14 further exchange and store usage status data, e.g., functional status, unused spare status or spare status, used in testing and fault status data, e.g., fault-free status, defective status or partially usable status, for each FPGA resource or programmable logic block tested for later use during reconfiguration. The utilization of the usage and fault status data is described in more detail below.

Figure 2:
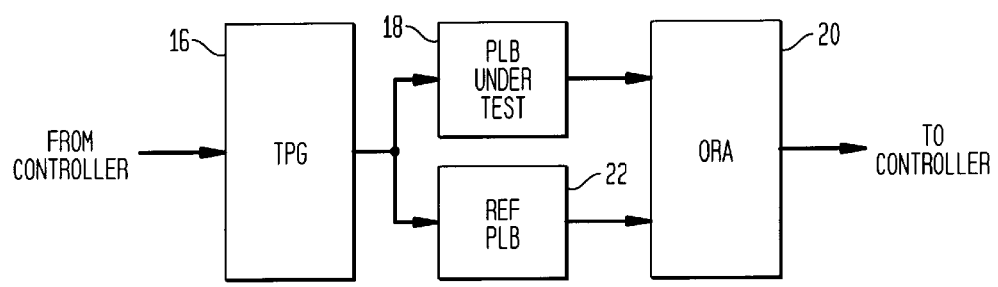
FIG. 2 is a schematic block diagram showing a preferred comparison based test structure configured with field programmable gate array resources including a test pattern generator, a programmable logic block under test, a reference programmable logic block and an output response analyzer.

Upon initiation of testing by the controller 12, test patterns are generated using a test pattern generator (TPG) 16. As shown in FIG. 2, the test patterns are received by a programmable logic block (PLB) under test 18 and a reference PLB 22. The outputs of the PLB under test 18 and the reference PLB 22 are compared by an output response analyzer (ORA) 20 to determine whether a fault exists within the PLB under test 18. A match/mismatch result of the comparison performed by the ORA 20 is communicated as a pass/fail result to the controller 12 for storage in memory 14 and utilization in conducting fault tolerant reconfiguration. In the preferred embodiment of the present invention as shown in FIG. 2, the TPG 16 and ORA 20 are configured from a portion of spare FPGA resources. The operation of the TPG 16 and ORA 20 in testing the PLB under test 18 is similar to the built-in self-test techniques utilized and described in detail in the above-noted pending U.S. patent applications.

In accordance with another aspect of the inventive method, complete testing of the PLB under test 18 is achieved by repeatedly reconfiguring the PLB under test for testing in every possible mode of operation. Without having a detailed knowledge of the implementation of the FPGA under test, the modes of operation of its programmable logic blocks may be determined only from the information provided in an associated FPGA data book. In addition to repeatedly reconfiguring the PLB under test 18, the TPG 16 is reconfigured for each new mode of operation of the PLB under test which requires test patterns different from the ones generated for the previous mode of operation. The ORA 20 also needs reconfiguring when the new mode of operation of the PLB under test 18 involves a different number of outputs. It is important to note that for the first time in the art all of these reconfigurations occur concurrently with the normal operation of the FPGA, which is unaffected and unaware of the testing activity.

Figure 3:
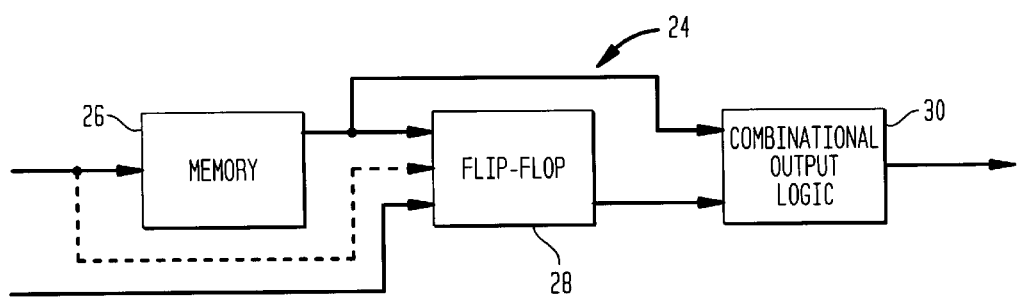
FIG. 3 is a schematic block diagram of a typical programmable logic block of a field programmable gate array.

As shown in FIG. 3, a typical programmable logic block 24 includes a memory block 26, a flip-flop block 28 and a combinational output logic block 30. The memory block 26 may be configured to operate as a random access memory (RAM) or as a combinational look-up table (LUT). In addition, combinational logic within the memory block 26 may be configured to operate as special combinational operators such as comparator, adder or multiplier. As an example of the several possible configurations of a memory block 26, the memory block modes of operation and the number of corresponding outputs are summarized for an ORCA Series 2CA Programmable Logic Block in Table 1 below.

TABLE 1

Memory Block modes of operation and the number of corresponding outputs for an ORCA Series 2CA Programmable Logic Block

| | Memory Block Modes of Operation | Number of Outputs |
|---|---|---|
| 1 | Async.RAM | 4 |
| 2 | Adder/Subtractor | 5 |
| 3 | 5-variable MUX | 4 |
| 4 | 5-variable XOR | 4 |
| 5 | Count up | 5 |
| 6 | Count up/Count down | 5 |
| 7 | Count down | 5 |
| 8 | 4-variable LUT | 4 |
| 9 | 5-variable LUT | 5 |
| 10 | Multiplier | 5 |
| 11 | >=Comparator | 5 |

TABLE 1-continued

Memory Block modes of operation and the number of corresponding outputs for an ORCA Series 2CA Programmable Logic Block

| | Memory Block Modes of Operation | Number of Outputs |
|---|---|---|
| 12 | ≠Comparator | 5 |
| 13 | Sync.RAM | 4 |
| 14 | Dual port RAM | 4 |

Similarly, the flip-flops in the flip-flop block 28 may operate as flip-flops or may be configured to operate as latches. In addition, other programming options dealing with synchronous and asynchronous Set and Reset, Clock Enable, etc. could be provided in association with operation as flip-flops or as latches. As an example, the several possible configurations of a flip-flop block 28, the flip-flop block modes of operation and associated options are summarized for an ORCA Series 2CA Programmable Logic Block in Table 2 below.

TABLE 2

Flip-Flop Block modes of operation for an ORCA series 2CA Programmable Logic Block.

Flip-Flop/Latch Modes of Operation & Options

| FF/Latch | Set/Reset | Clock | Clock Enable | Flip-Flop Data In |
|---|---|---|---|---|
| 1 FF | Asyncronous R | Falling Edge | Active Low | Programmable logic block Input |
| 2 FF | Asyncronous S | Falling Edge | Enabled | Programmable logic block Input |
| 3 Latch | Syncronous S | Active Low | Active High | WUT Output |
| 4 FF | Syncronous R | Rising Edge | Active Low | Programmable logic block Input |
| 5 Latch | — | Active High | Active Low | Dynamic Select |

The combinational output logic block 30, on the other hand, typically contains a multiplexer in order to connect different wire segments to the output of the programmable logic block 24. The combinational output logic block 30 typically has no feedback loops and the flip-flop block 28 can be directly accessed by bypassing the memory block 26 (shown in dashed lines in FIG. 3). Advantageously, the inputs and outputs of every subcircuit or block in this type of simple structure are easy to control and observe, thus facilitating nearly independent testing of the blocks.

In accordance with an important aspect of the inventive method, the PLB under test 18 is completely tested in every possible mode of operation. To accomplish such a complete test, the PLB under test 18 is repeatedly reconfigured and test patterns sufficient to detect all possible faults in the memory, flip-flop or combinational output logic blocks of the PLB under test are applied. More specifically, exhaustive testing is utilized to test each block of the PLB under test with sets of exhaustive test patterns. The sets of exhaustive test patterns are generated by the test pattern generator 16 and depend solely upon the mode of operation of the targeted block of the PLB under test.

For example, a memory block 26 configured as a five variable LUT with 5 outputs (see Table 1, Item 9) requires the test pattern generator 16 to generate a set of all possible thirty-two input test patterns. A memory block 26 configured as RAM, on the other hand, requires the test pattern generator 16 to generate only a set of standard RAM sequences which are known in the art to be exhaustive for typical RAM fault models. Such a set of typical RAM fault models include pattern-sensitive faults, for example.

Advantageously, this type of exhaustive testing of the blocks of the PLB under test results in maximum fault coverage without the need for explicit fault model assumptions. Therefore, the present method of testing the programmable logic blocks of an FPGA is certain to detect all faults including single stuck-at faults and multiple stuck-at faults in the PLB under test 18 without the need for fault simulations. In general, the exhaustive methods of the present invention detect all faults which do not increase the number of states in the PLB under test 18, such as a bridging fault which introduces feedback. Although most faults which increase the number of states in the PLB under test 18 are detected by the present method of testing, the detection of every such fault cannot be guaranteed.

In accordance with the preferred method of the present invention, the sets of exhaustive test patterns are first applied to the memory block 26 of the PLB under test 18 bypassing the flip-flop block 28, then to the flip-flop block 28 bypassing the memory block 26, and finally to the paths between the memory block 26 and the flip-flop block 28.

As noted above, the combinational output logic block 30 typically contains multiplexing logic for different connections between the outputs of the memory block 26 or the outputs of the flip-flop blocks 28, and the outputs of the PLB under test 18. It should be appreciated that the different paths through the combinational logic output block 30 can be tested in conjunction with either the memory block 26 or the flip-flop block 28.

Approaching the test in the above manner allows a defective block and its failing mode(s) of operation to be identified and any mode of operation that does not fail to be identified as fault-free. It is understood that the required number of configurations and the overall time involved in reconfiguring the blocks could be reduced by testing the memory block 26 and the flip-flop block 28 simultaneously. However, this would also reduce the diagnostic resolution of the test, and, as a result, the ability to provide on-line fault tolerant reconfiguration of the programmable logic blocks of the FPGA under test would be limited.

The accurate and sufficiently high resolution provided by the present inventive method, i.e., locating a defective block inside the PLB under test 18, advantageously allows the system to perform on-line fault tolerant reconfiguration enabling the PLB under test 18 to be reconfigured as a partially usable programmable logic block for a further specific use. Compared to the prior art test approaches of testing limited modes of operation and simply discarding defective or faulty programmable logic blocks, completely testing each programmable logic block in every mode of operation and providing fault tolerant reconfiguration for partially faulty programmable logic blocks allows for a more graceful degradation of the FPGA, thus extending the useful life of the FPGA and its associated hardware.

To further emphasize and better illustrate these differences, assume that the only failure of the PLB under test 18 having the modes of operation set forth in Tables 1 and 2 above is obtained during a multiplier mode (see Table 1, Item 10) test. Since the remaining modes of operation of the PLB under test 18 each pass their respective exhaustive tests, a conclusion can be made that only some of the logic circuits of the PLB under test 18 involved in the multiplier mode of operation are faulty. Therefore, in accordance with the present method, future utilization of this particular PLB under test 18 will be limited by the test and reconfiguration controller 12 to operational and test configurations not involving the multiplier mode of operation. In other words, the future utilization of the PLB under test 18 is limited based on the outcome of its complete test.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fault tolerant reconfiguration and operation of a field programmable gate array during normal on-line operation comprising the steps of:

selecting a programmable logic block for testing;

applying test patterns to said programmable logic block under test;

detecting the existence of at least one faulty mode of operation; and reconfiguring the utilization of said programmable logic block under test dependent upon said detecting step so as not to operate in said detected faulty mode, whereby partially faulty programmable logic blocks may be further utilized or reconfigured into properly operating configurations to provide fault tolerant operation of the field programmable gate array.

2. The method set forth in claim 1 further comprising the step of repeatedly reconfiguring said programmable logic block under test in order to test said programmable logic block under test completely in all possible modes of operation.

3. The method set forth in claim 2, wherein said test patterns are exhaustive and sufficient to detect all possible faults in said programmable logic block under test.

4. The method set forth in claim 3, wherein said detecting step further includes the step of locating faulty modules and modes of operation of said programmable logic block under test to enable on-line fault tolerant reconfiguration.

5. The method set forth in claim 1 further comprising the steps of:

determining an intended mode of operation of said programmable logic block under test;

storing fault status data for said programmable logic block under test; and comparing said intended mode of operation with said fault status data, whereby partially usable programmable logic blocks may be allowed to continue to operate for limited purposes.

6. A method of fault tolerant reconfiguration and operation of a field programmable gate array during normal on-line operation comprising the steps of:

testing modules of a programmable logic block under test;

detecting the existence of at least one faulty mode of operation in said modules of said programmable logic block under test; and reconfiguring the utilization of said modules of said programmable logic block under test dependent upon said detecting step so as not to operate in any detected faulty mode, whereby programmable logic blocks with one or more faults but which can be configured into an operating mode that is not faulty may be reconfigured into properly operating configurations to provide fault tolerant operation of the field programmable gate array.

7. The method set forth in claim 6, wherein said testing step further includes:

applying test patterns to said modules of said programmable logic block under test; and repeatedly reconfiguring said programmable logic block under test including said modules in order to test said modules completely in all possible modes of operation.

8. The method set forth in claim 7, wherein said test patterns are exhaustive and sufficient to detect all possible faults in said modules of said programmable logic block under test.

9. The method set forth in claim 6, further comprising the steps of:

determining an intended mode of operation of said modules of said programmable logic block under test;

storing fault status data for said modules of said programmable logic block under test; and comparing said intended mode of operation with said fault status data, whereby partially usable programmable logic blocks may be allowed to continue to operate for limited purposes.

10. A method of fault tolerant operation of a field programmable gate array comprising the steps of:

testing programmable logic blocks of the field programmable gate array during on-line operation;

storing test results for each mode of operation of said programmable logic blocks under test;

determining an intended mode of operation for each of said programmable logic blocks under test;

comparing the intended mode of operation for each of said programmable logic blocks under test with the stored results for each mode of operation of each of said programmable logic blocks under test to determine if each of said programmable logic block under test is capable of performing its intended mode of operation; and reconfiguring any of said programmable logic blocks under test that are incapable of performing their intended mode of operation into a properly operating mode configuration, whereby programmable logic blocks having one or more faults which hinder the intended operating mode but which can be reconfigured into an operating mode that is not faulty may be reconfigured into properly operating configurations to provide fault tolerant operation of the field programmable gate array.

11. An apparatus for locating and reconfiguring for further use during operation partially faulty programmable logic blocks of a field programmable gate array comprising:

a controller in communication with said field programmable gate array (a) for detecting the existence of at least one faulty mode of operation of said programmable logic block under test and (b) for reconfiguring said programmable logic block under test for further operation in a mode not detected to be faulty; and a memory in communication with said controller for storing usage and fault status data for each programmable logic block under test, whereby partially usable programmable logic blocks may be allowed to continue to operate in properly functioning configurations.

12. The apparatus of claim 10, further comprising a test pattern generator for generating exhaustive test patterns sufficient to detect all possible faults in said programmable logic block under test.

* * * * *